(12) United States Patent
Chen et al.

(10) Patent No.: US 7,663,208 B2
(45) Date of Patent: Feb. 16, 2010

(54) PUNCH TYPE SUBSTRATE STRIP

(75) Inventors: Kuo Hua Chen, Penghu Hsien (TW); She Hong Cheng, Tainan (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 379 days.

(21) Appl. No.: 11/700,224

(22) Filed: Jan. 31, 2007

(65) Prior Publication Data

US 2007/0195508 A1 Aug. 23, 2007

(30) Foreign Application Priority Data

Feb. 22, 2006 (TW) .............................. 95105993 A

(51) Int. Cl.
*H01K 7/00* (2006.01)
(52) U.S. Cl. ............................... 257/666; 257/E23.055
(58) Field of Classification Search .......... 257/E23.055, 257/666
See application file for complete search history.

(56) References Cited

U.S. PATENT DOCUMENTS 6,262,473 B1 * 7/2001 Hashimoto ................. 257/668

FOREIGN PATENT DOCUMENTS

| TW | 152189 | 3/2001 |
|----|--------|--------|
| TW | 1246380 | 6/2004 |

* cited by examiner

*Primary Examiner*—Sue Purvis
*Assistant Examiner*—Krista Soderholm
(74) *Attorney, Agent, or Firm*—Lowe Hauptman Ham & Berner

(57) ABSTRACT

A punch type substrate strip includes a plurality of substrate units, a plurality of slots and at least one plating-trace collecting hole. The slots are formed around the substrate units. The plating-trace collecting hole is located outside the substrate units. The substrate strip is provided with a plurality of connecting pads, a plurality of first plating traces and at least one second plating trace. The connecting pads are disposed in each substrate unit, and the first plating traces and the second plating trace are electrically connected to the connecting pads. The first plating traces have a plurality of first broken ends located in the slots. The second plating trace is extended across a region located between the slots, and has a second broken end located in the plating-trace collecting hole. Accordingly, more extensive space for plating traces can be provided.

8 Claims, 4 Drawing Sheets

PUNCH TYPE SUBSTRATE STRIP

CROSS REFERENCE TO RELATED APPLICATION

This application claims the priority benefit of Taiwan Patent Application Serial Number 095105993, filed Feb. 22, 2006, the full disclosure of which is incorporated herein by reference.

BACKGROUND OF THE INVENTION

1. Field of the Invention

The present invention generally relates to a punch type substrate strip, and more particularly to a punch type substrate strip, wherein the layout space of broken ends of the plating traces can be increased after plating.

2. Description of the Related Art

A conventional punch type substrate strip includes a plurality of substrate units which are integrated thereon. The substrate units function as chip carriers for manufacturing various integrated circuit (IC) packages or integrated circuit (IC) modules. Then, the IC packages or the IC modules are separated from each other by means of punching. Since the size of the IC package is gradually minimized, the density for the circuit layout of the substrate unit is gradually increased. Relatively, the space of the circuit layout is gradually reduced. If the inner circuit of the substrate unit is directly changed, then the electrical communication, the electrical shield, the added cost of circuit layers and the strength of the combined dielectric layers of the substrate unit are affected. Thus, it is important to improve the spaces of two side edges of the substrate strip in order to avoid changing the inner circuit of the substrate unit. Otherwise, the original design of the final product will be affected.

Taiwan Patent Number 1246380, entitled "Fabrication Method of a Printed Circuit Board", discloses a method for making a broken circuit of a conductive finger. A plating trace is adapted for electrically connecting a ground/power line to a plating bus located around a printed circuit board. Furthermore, a transmission line (i.e. additional line of the plating trace) is adapted for electrically connecting a ground/power line to a conductive finger. Then, a solder mask is patterned and formed so as to specially expose out the conductive finger and to cover the transmission line, whereby the conductive finger is plated. Then, the transmission line is removed by means of etching so as to form a broken circuit between the conductive finger and the plating bus, thereby prevent the conductive finger (or the inner circuit connected thereto) from damage of electrostatic discharge. The broken circuit is located at the original location of the transmission line and inside the printed circuit board, and thus the design of the inner circuit of the substrate has been changed and the manufacturing processes have been increased. In addition, the printed circuit board has no slots, and thus the method for making the broken circuit of the conductive finger cannot be applied to a punch type substrate strip.

Furthermore, Taiwan Patent Publication Number 479334, entitled "Method for Manufacturing Plating Traces for Ball Grid Array Chip Package", discloses a method for making broken circuits of plating traces. In the prior art, a punch type substrate strip includes a plurality of plating traces adapted for respectively electrically connecting conductive fingers to a plating bus located outside substrate units. After a plating process, a slot is formed in next process and located at the original location of the plating bus, whereby the broken circuits of the plating traces are formed, and thus the plating traces are respectively electrically isolated. However, the layout of most of the plating traces is restricted by the length of the slot.

As shown in FIG. 1, a conventional punch type substrate strip 1 includes a plurality of substrate units 10. Also, the punch type substrate strip 1 includes a plurality of slots 20, which are formed around the substrate units 10, so as to be conveniently punched. The substrate strip 1 is provided with a plurality of connecting pads 11 and a plurality of plating traces 12. The connecting pads 11 are disposed in the substrate units 10, and the plating traces 12 are electrically connected to the connecting pads 11. The plating traces 12 have a plurality of broken ends 12A located at the inner long edge 21 of the slot 20. When the layout space of the plating traces 12 is not enough, it is necessary that a plurality of plating traces 13 are laterally extended to the inner short edge 22 of the slot 20. The plating traces 13 also have a plurality of broken ends 13A at the inner short edge 22 of the slot 20. The amount of the broken ends 13A is restricted by the width of the inner short edge 22 of the slot 20, and thus there is not more extensive space for dense plating traces to be provided.

Accordingly, there exists a need for a punch type substrate strip capable of solving the above-mentioned problems.

SUMMARY OF THE INVENTION

It is an object of the present invention to provide a punch type substrate strip includes a plurality of substrate units, a plurality of slots and at least one plating-trace collecting hole (or at least one plating-trace collecting notch). The slots are formed around the substrate units. The plating-trace collecting hole (or the plating-trace collecting notch) is located outside the substrate units. Parts of second plating traces can be extended to the plating-trace collecting hole (or the plating-trace collecting notch), and have broken ends located in the plating-trace collecting hole (or the plating-trace collecting notch), whereby more extensive space for plating traces can be provided, the layout space of broken ends of the plating traces can be increased, the gap between plating traces can be increased, and the problem of excessively dense plating traces can be solved.

According to the present invention, a punch type substrate strip includes a plurality of substrate units, a plurality of slots and at least one plating-trace collecting hole (or at least one plating-trace collecting notch). The slots are formed around the substrate units. The plating-trace collecting hole (or the plating-trace collecting notch) is located outside the substrate units. The substrate strip is provided with a plurality of connecting pads, a plurality of first plating traces and at least one second plating trace. The connecting pads are disposed in each substrate unit, and the first plating traces and the second plating trace are electrically connected to the connecting pads. The first plating traces have a plurality of first broken ends located in the slots. The second plating trace is extended to the plating-trace collecting hole (or the plating-trace collecting notch), and has a second broken end located in the plating-trace collecting hole, whereby the gap between plating traces can be increased, and the problem of excessively dense plating traces can be solved.

The foregoing, as well as additional objects, features and advantages of the invention will be more apparent from the following detailed description, which proceeds with reference to the accompanying drawings.

DETAILED DESCRIPTION OF THE PREFERRED EMBODIMENT

Figure 1:
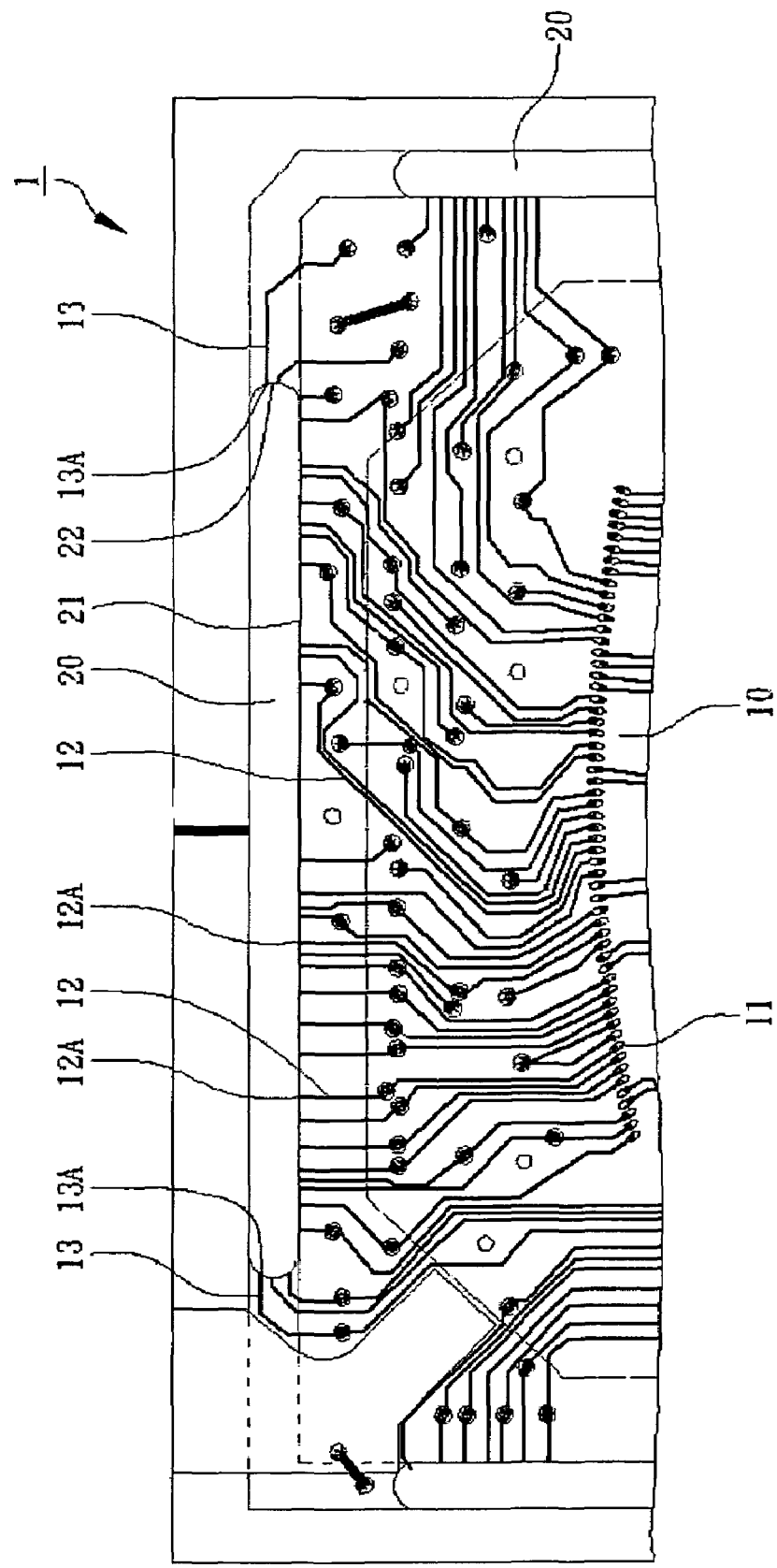
FIG. 1 is an expanded plan schematic view of a punch type substrate strip in the prior art, showing plating traces.
Figure 2:
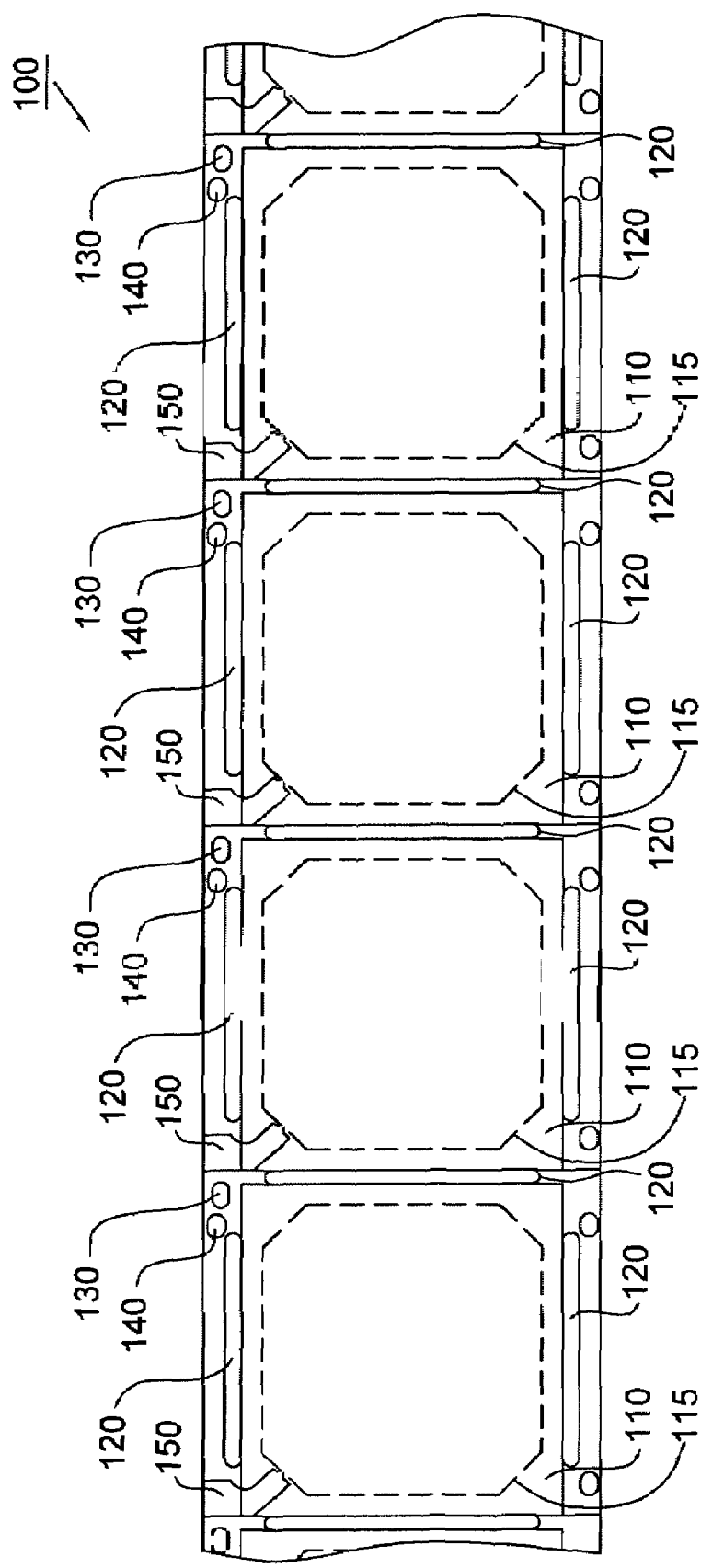
FIG. 2 is a plan schematic view of a punch type substrate strip according to the first embodiment of the present invention.

Referring to FIG. 2, it depicts a punch type substrate strip 100 according to the first embodiment of the present invention. The substrate strip 100 includes a plurality of substrate units 110. The substrate units 110 function as chip carriers for manufacturing various integrated circuit (IC) packages or integrated circuit (IC) modules. The substrate strip 100 further includes a plurality of slots 120 and at least one plating-trace collecting hole 130. The slots 120 are formed around the substrate units 110, whereby the substrate units 110 can be easily separated from each other by means of punching after a packaging process or a module process. The slots 120 can be bar-shaped hole or L-shaped hole. In this embodiment, the slot 120 is the bar-shaped hole. The plating-trace collecting hole 130 is located outside the substrate units 110, i.e. the plating-trace collecting hole 130 is located at a scrap region of the substrate strip 100. In this embodiment, the plating-trace collecting hole 130 is adjacent to at least one of corners of each substrate unit 110. Furthermore, each substrate unit 110 defines an encapsulating region 115, and an injection opening 150 is formed at one of corners of each substrate unit 110. The injection opening 150 is extended to the encapsulating region 115 and thereby molds an encapsulant (not shown) on the encapsulating region 115 through the injection opening 150. Thus, the mold can be easily removed without damaging the inside circuit of each substrate unit 110.

Figure 3:
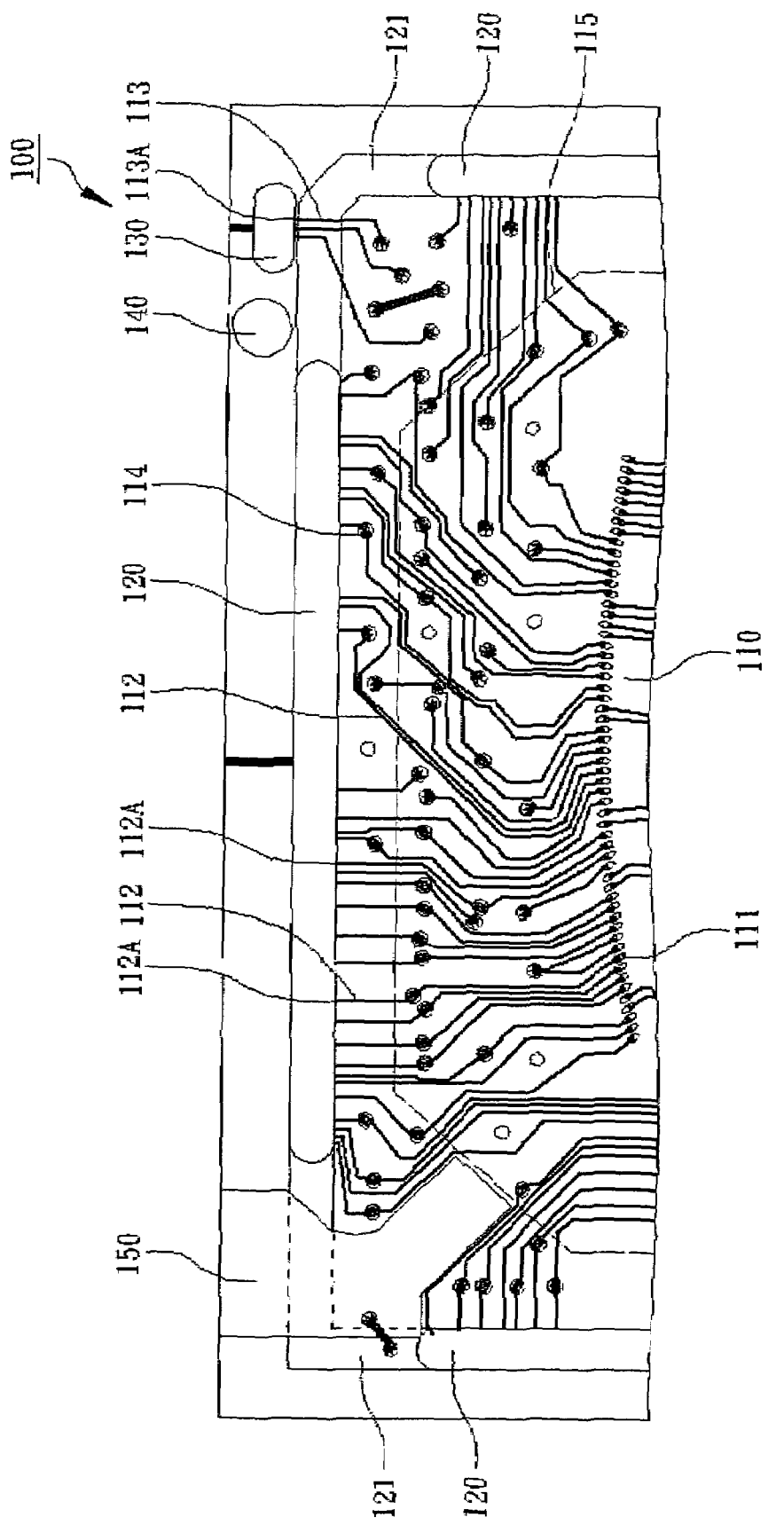
FIG. 3 is an expanded plan schematic view of the punch type substrate strip according to the first embodiment of the present invention, showing at least one plating-trace collecting hole.

Referring to FIG. 3, the substrate strip 100 are provided with a plurality of connecting pads 111, a plurality of first plating traces 112 and at least one second plating trace 113. The connecting pads 111 are disposed in each substrate unit 110, and the first plating traces 112 and the second plating trace 113 are electrically connected to the connecting pads 111. The slots 120 and the plating-trace collecting hole 130 are formed after the plating process, and thus a plating metal layer has been formed on the connecting pads 111. In addition, in this embodiment, the substrate strip 100 is further provided with a plurality of via holes 114, which are adapted for electrically connecting the connecting pads 111 to ball pads or outer pads (not shown) disposed on the other surface of the substrate strip 100. Also, the via holes 114 are electrically connected to the first plating traces 112 and the second plating trace 113.

The first plating traces 112 have a plurality of first broken ends 112A located in the slots 120. In this embodiment, the first broken ends 112A are arranged at one of inner long edges of the slot 120. The second plating trace 113 is extended across a region located between the slots 120, and has a second broken end 113A located in the plating-trace collecting hole 130. In this embodiment, the region located between the slots 120 is defined as a punching region 121, and the second plating trace 113 passes though the punching region 121. Since the first plating traces 112 have the first broken ends 112A located in the slots 120 and the second plating trace 113 has the second broken end 113A located in the plating-trace collecting hole 130, they can prevent the substrate strip 100 from damage of electrostatic discharge (ESD) when the substrate strip 100 is conveyed. In addition, the plating-trace collecting hole 130 collects the second broken end 113A of the second plating trace 113, whereby the gap between plating traces can be increased, and the problem of excessively dense plating traces can be solved. Furthermore, in this embodiment, referring to FIGS. 2 and 3 again, the substrate strip 100 is further provided with a plurality of orientation holes 140 adapted for positioning the substrate strip 100 to a processing apparatus (not shown) so as to conveniently convey the substrate strip 100. The plating-trace collecting hole 130 can be adjacent to one of the orientation holes 140.

In the first embodiment of the present invention, the plating-trace collecting hole 130 can be a through hole. In an alternative embodiment, the plating-trace collecting hole 130 can be different from the through hole, e.g. the plating-trace collecting hole 130 can be a concave groove.

Figure 4:
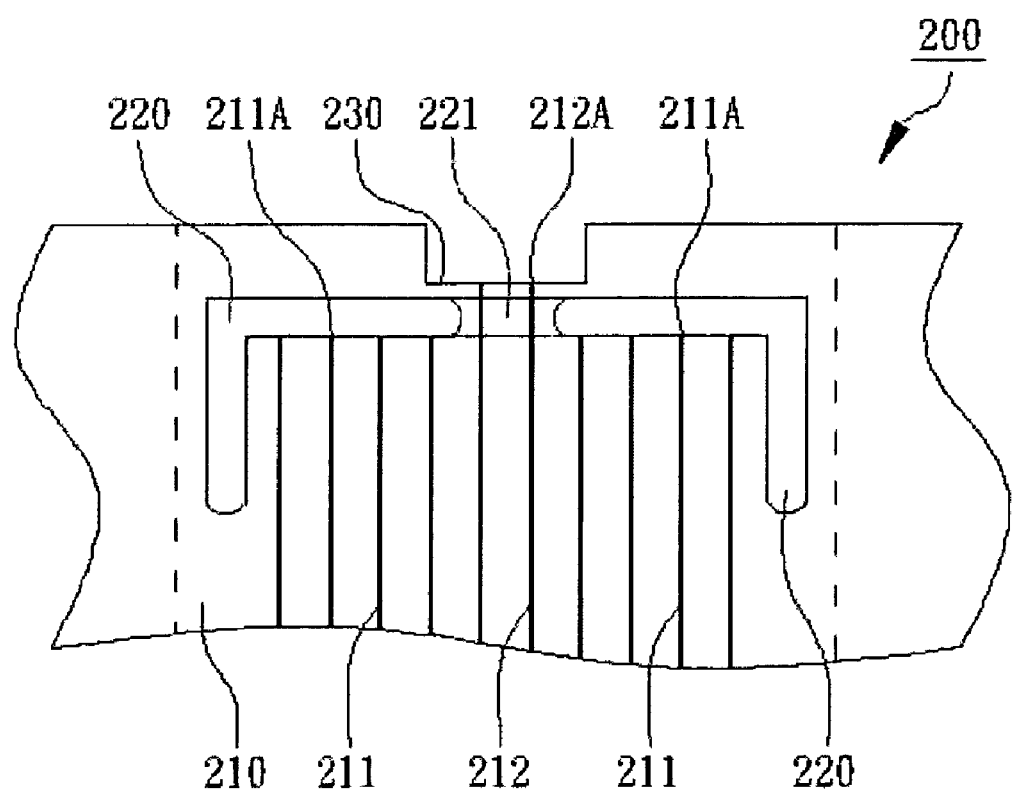
FIG. 4 is an expanded plan schematic view of another punch type substrate strip according to the second embodiment of the present invention, showing plating traces.

Referring to FIG. 4, it depicts another punch type substrate strip 200 according to the second embodiment of the present invention. The substrate strip 200 includes a plurality of substrate units 210. The substrate strip 200 further includes a plurality of slots 220 and at least one plating-trace collecting notch 230. The slots 220 are formed around the substrate units 210, whereby the substrate units 210 can be easily separated from each other by means of punching. In this embodiment, the slots 220 can be L-shaped hole 220. The plating-trace collecting notch 230 is located outside the substrate units 210, and the plating-trace collecting notch 230 can be U-shaped or arc-shaped. The substrate strip 200 are provided with a plurality of first plating traces 211 and at least one second plating trace 212. The first plating traces 211 and the second plating trace 212 are disposed in the substrate units 210, and are electrically connected to correlative connecting pads or via holes, whereby a plating metal layer is formed on the metal surface of the connecting pads before the slots 220 are formed. The first plating traces 211 have a plurality of first broken ends 211A located in the slots 220. The second plating trace 212 is extended across a region located between the slots 220, and has a second broken end 212A located in the plating-trace collecting notch 230, thereby preventing the substrate strip 200 from damage of electrostatic discharge (ESD) when the substrate strip 200 is conveyed. The plating-trace collecting notch 230 collects the second broken end 212A of the second plating trace 212, whereby more extensive space for plating traces can be provided, the gap between plating traces can be increased, and the problem of excessively dense plating traces can be solved.

Although the invention has been explained in relation to its preferred embodiment, it is not used to limit the invention. It is to be understood that many other possible modifications and variations can be made by those skilled in the art without departing from the spirit and scope of the invention as hereinafter claimed.

What is claimed is:

1. A substrate strip comprising:
  a plurality of substrate units;
  a plurality of slots formed around the substrate units;
  at least one plating-trace collecting hole located outside the substrate units;
  a plurality of connecting pads disposed in each substrate unit; and
  a plurality of first plating traces and at least one second plating traces, wherein the first plating traces and the second plating traces are electrically connected to the connecting pads, the first plating traces have a plurality of first broken ends located in the slots, the second plating trace is extended across a region located between the slots, and the second plating trace has a second broken end located in the plating-trace collecting hole;

wherein the region located between the slots is defined as a punching region, and the second plating trace passes though the punching region.

2. The substrate strip as claimed in claim 1, further comprising a plurality of orientation holes, wherein the plating-trace collecting hole is adjacent to one of the orientation holes.

3. The substrate strip as claimed in claim 1, further comprising a plating metal layer formed on each connecting pad.

4. The substrate strip as claimed in claim 1, wherein the slots are bar-shaped hole or L-shaped hole.

5. A substrate strip comprising:

a plurality of substrate units;

a plurality of slots formed around the substrate units;

at least one plating-trace collecting notch located outside the substrate units;

a plurality of connecting pads disposed in each substrate unit; and a plurality of first plating traces and at least one second plating traces, wherein the first plating traces and the second plating trace are electrically connected to the connecting pads, the first plating traces have a plurality of first broken ends located in the slots, the second plating trace is extended across a region located between the slots, and the second plating trace has a second broken end located in the plating-trace collecting notch;

wherein the region located between the slots is defined as a punching region, and the second plating trace passes though the punching region.

6. The substrate strip as claimed in claim 5, further comprising a plating metal layer formed on each connecting pad.

7. The substrate strip as claimed in claim 5, wherein the slots are bar-shaped hole or L-shaped hole.

8. The substrate strip as claimed in claim 5, wherein the plating-trace collecting notch is U-shaped or arc-shaped.

* * * * *